(12) United States Patent
Alur et al.

(10) Patent No.: US 10,424,530 B1
(45) Date of Patent: Sep. 24, 2019

(54) ELECTRICAL INTERCONNECTIONS WITH IMPROVED COMPLIANCE DUE TO STRESS RELAXATION AND METHOD OF MAKING

(71) Applicant: Intel Corporation, Santa Clara, CA (US)

(72) Inventors: Siddharth K. Alur, Chandler, AZ (US); Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/014,077

(22) Filed: Jun. 21, 2018

(51) Int. Cl.
| | |
|---|---|
| H01L 23/48 | (2006.01) |
| H01L 23/52 | (2006.01) |
| H01L 29/40 | (2006.01) |
| H01L 23/373 | (2006.01) |
| H01L 23/498 | (2006.01) |
| H01L 21/48 | (2006.01) |
| H01L 23/367 | (2006.01) |

(52) U.S. Cl.
CPC ........ H01L 23/3735 (2013.01); H01L 21/486 (2013.01); H01L 23/3675 (2013.01); H01L 23/49827 (2013.01); H01L 23/49866 (2013.01)

(58) Field of Classification Search
USPC .......................... 257/737, 678–733, 787–796, 257/E23.001–E23.194; 438/15, 26, 51, 438/55, 64, 106, 124–127
See application file for complete search history.

(56) References Cited

U.S. PATENT DOCUMENTS

| | | | | |
|---|---|---|---|---|
| 8,729,709 | B2 * | 5/2014 | Baba | H01L 23/49822 257/774 |
| 8,830,691 | B2 * | 9/2014 | Inagaki | H01L 21/4857 361/763 |
| 8,891,246 | B2 * | 11/2014 | Guzek | H01L 23/49816 361/707 |
| 2011/0266033 | A1 * | 11/2011 | Tada | H05K 1/186 174/251 |
| 2014/0307402 | A1 * | 10/2014 | Sugiyama | H05K 1/185 361/761 |
| 2014/0356635 | A1 * | 12/2014 | Kim | H05K 1/0271 428/433 |
| 2017/0373011 | A1 * | 12/2017 | Gowda | H01L 23/5389 |
| 2018/0076103 | A1 * | 3/2018 | Jeon | H01L 23/045 |
| 2018/0182699 | A1 * | 6/2018 | Lai | H01L 23/5223 |
| 2018/0182841 | A1 * | 6/2018 | Sturcken | H01L 28/10 |
| 2018/0226357 | A1 * | 8/2018 | Kong | H05K 3/4038 |
| 2019/0057915 | A1 * | 2/2019 | Starkston | H01L 23/13 |

* cited by examiner

*Primary Examiner* — Niki H Nguyen
(74) *Attorney, Agent, or Firm* — Schwegman Lundberg & Woessner, P.A.

(57) ABSTRACT

According to various embodiments of the present disclosure, an electrically conductive pillar having a substrate is disclosed. The electrically conductive pillar can comprise a first portion, second portion and a third portion. The first portion and/or third portion can be formed of an electrically conductive material that can be the same or different. The second portion can be intermediate and abut both the first portion and the third portion. The second portion can comprise a solder element formed of a second electrically conductive material that differs from the electrically conductive material and has a second stiffness less than a stiffness of the electrically conductive material.

21 Claims, 6 Drawing Sheets

US 10,424,530 B1

ELECTRICAL INTERCONNECTIONS WITH IMPROVED COMPLIANCE DUE TO STRESS RELAXATION AND METHOD OF MAKING

BACKGROUND

This document pertains generally, but not by way of limitation, to electrical interconnections, and more particularly to providing more compliant interconnections that can better absorb coefficient of thermal expansion (CTE) mismatch between and within microelectronic devices.

BACKGROUND

Microelectronic devices are packaged in multiple ways. Many forms of microelectronic devices, such as IC (integrated circuit) packages, include a substrate supporting one or more microelectronic components embedded within the substrate (i.e., retained at least partially beneath a surface of the substrate) to form at least a portion of an embedded die package.

When microelectronic devices are packaged in certain frameworks (e.g., mounted in first-die, mid-die or die-on-die architectures) they can be subject to die cracking and other stress related defects. Such defects can occur during assembly or operation (e.g., due to thermal cycling). For example, with the die-on-die architecture, once die-to-die electrical interconnections are completed along with underfill, the combination of die packages act as a single composite die package system. However, the first of the combination of the die packages may utilize high stiffness, lower CTE materials (e.g., silicon) while the second of the combination of the die packages may utilize a relatively higher CTE materials. In such situations, the first of the combination of the die packages would experience high stress and could be subject to die cracking during assembly onto the second of the combination of the die packages due to the CTE mismatch.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

Reference will now be made in detail to certain embodiments of the disclosed subject matter, examples of which are illustrated in part in the accompanying drawings. Other embodiments may incorporate structural, logical, electrical, process, and other changes. Portions and features of some embodiments may be included in, or substituted for, those of other embodiments. While the disclosed subject matter will be described in conjunction with the enumerated claims, it will be understood that the exemplified subject matter is not intended to limit the claims to the disclosed subject matter.

The present inventors have recognized that in some situations conventional die-to-die electrical interconnections can lack sufficient compliance such as in situations of CTE mismatch. The inventors therefore propose more compliant die interconnections that can better absorb CTE mismatch, and thereby, reduce the likelihood of die cracking or other CTE related failure. Accordingly, in one embodiment, the inventors propose within the substrate having electrically conductive pillars that utilize a solder (e.g., a Tin (Sn) alloy) sandwiched between more traditional electrically conductive pillar materials (e.g., Cu, Cu alloy, Ag, Ag alloy). During reflow when the microelectronic device is assembled with a second microelectronic device, the solder, which is disposed in the substrate, can become molten or otherwise compliant, thereby providing for absorption of stress generated by any CTE mismatch between the microelectronic device and the second microelectronic device. The present application utilizes the term "second microelectronic device", which can include variously and non-exhaustively: another microelectronic device, an electronic system, a mother board, a mass storage device, a network interface, or the like.

Figure 1:
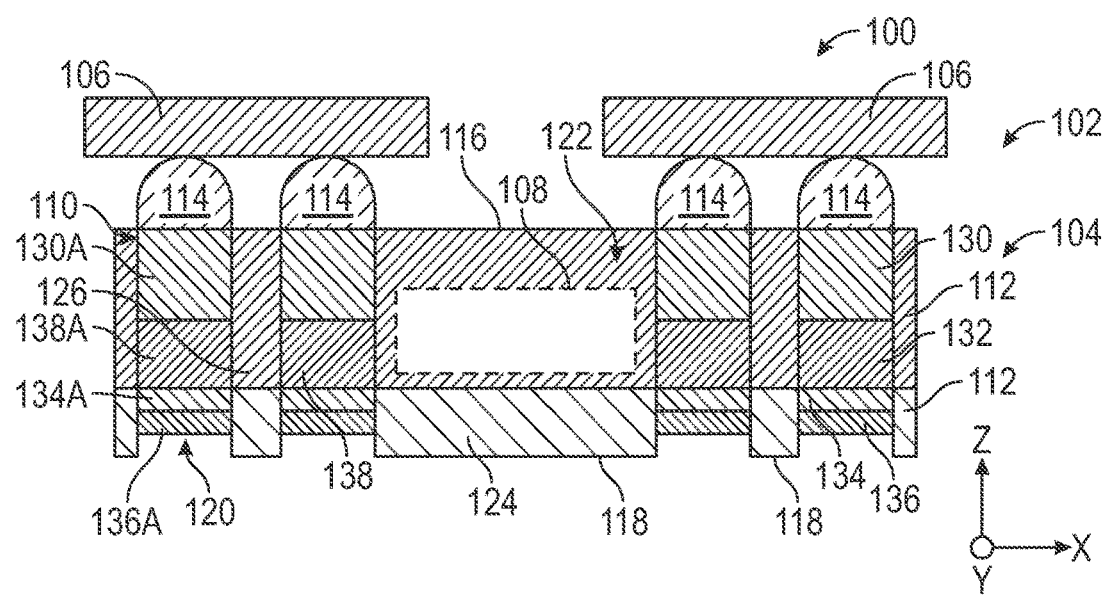
FIG. 1 is a cross-section of a schematic representation of a microelectronic system including microelectronic device comprising an integrated circuit package having compliant thermally conductive pillars, in accordance with an example of the present application.
Figure 2A:
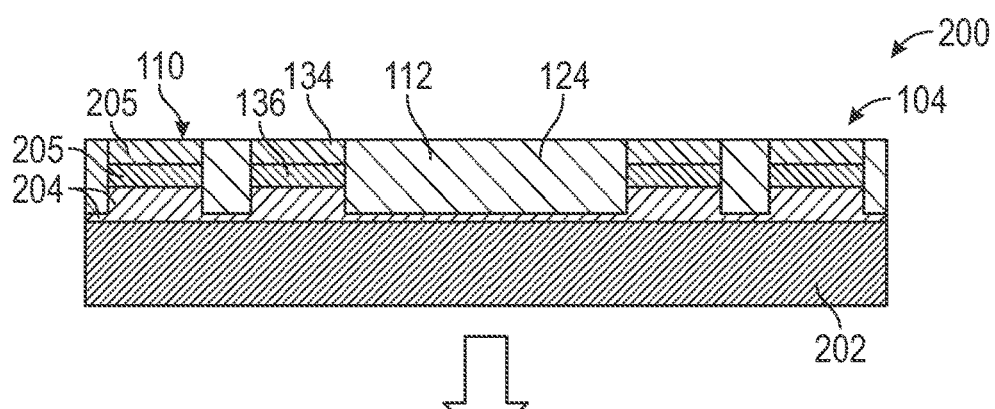
FIGS. 2(a)-2(h) are a series of cross-sections showing schematic representations of a method of fabricating the microelectronic device of FIG. 1, in accordance with the techniques and structures described herein.
Figure 2B:
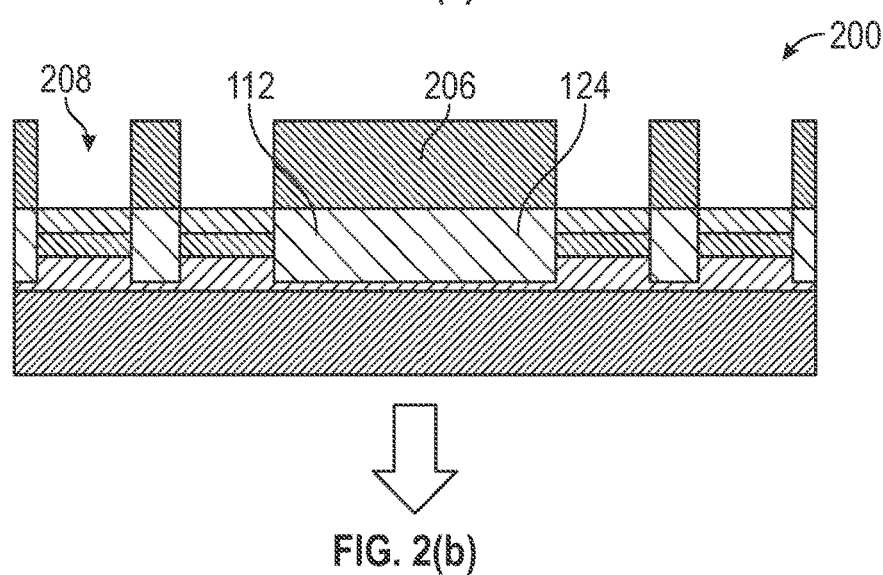
Figure 2C:
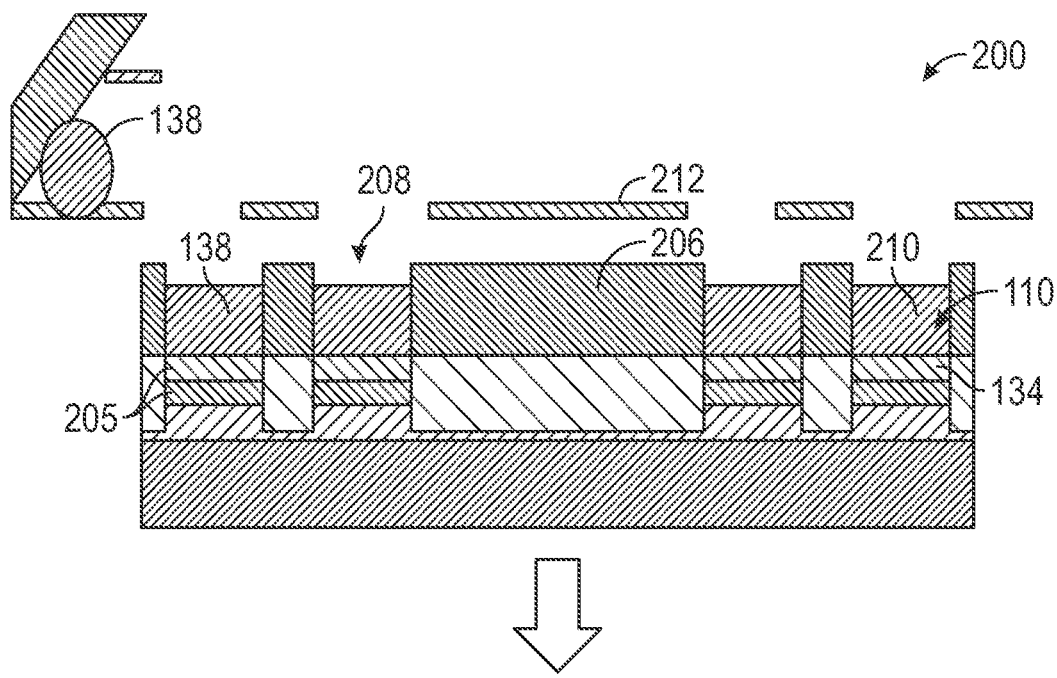
Figure 2D:
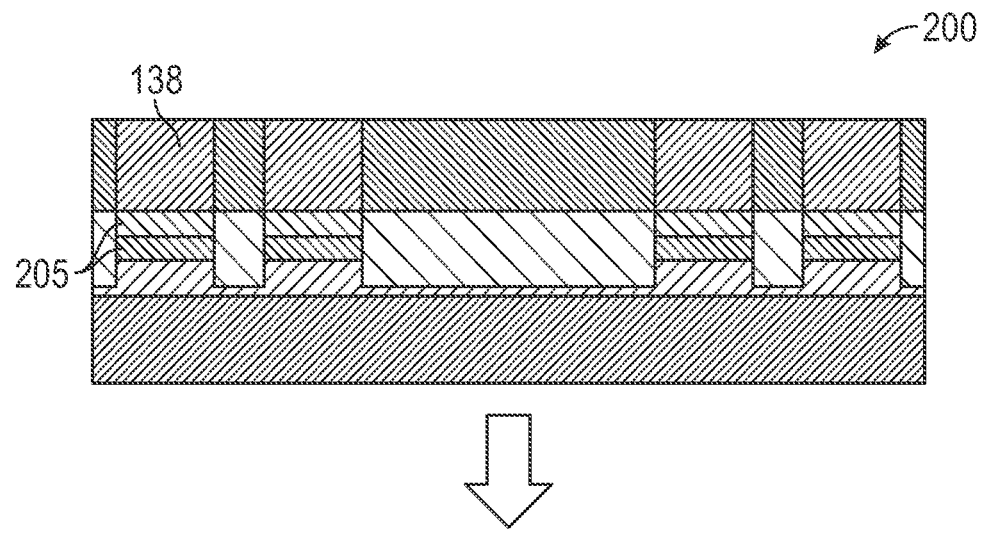
Figure 2E:
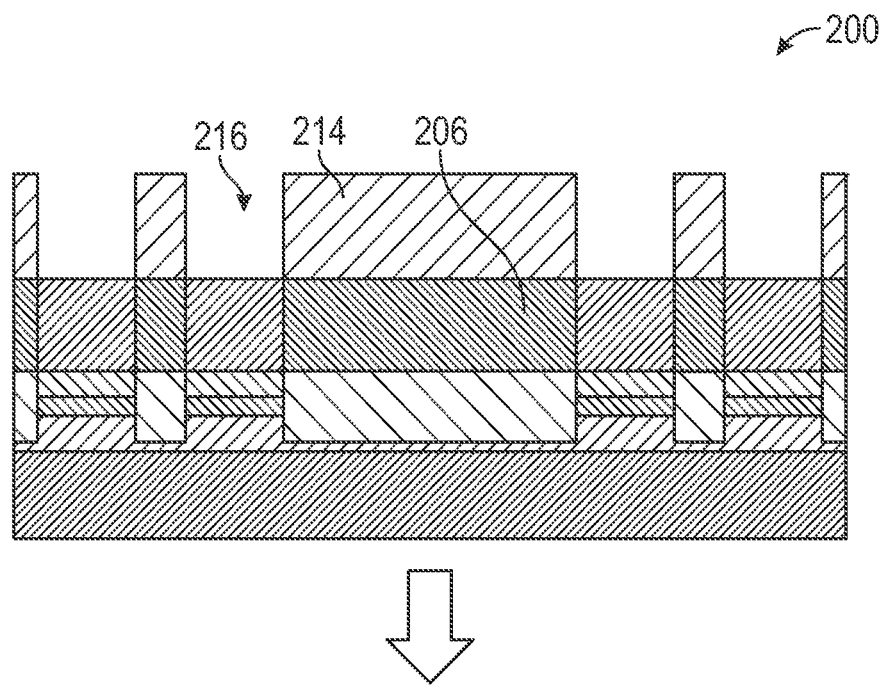
Figure 2F:
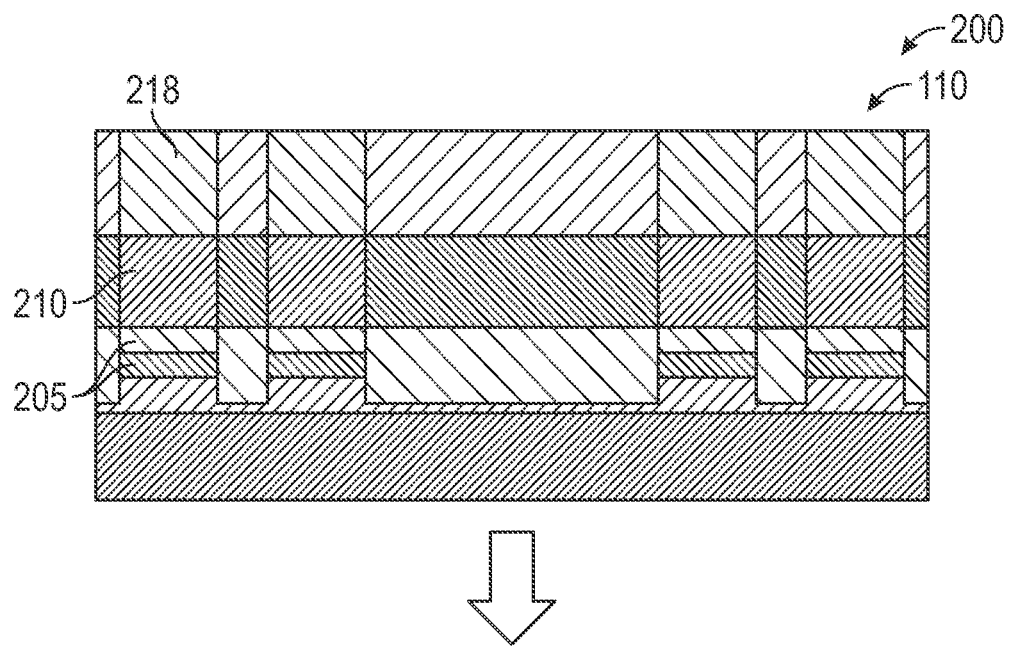
Figure 2G:
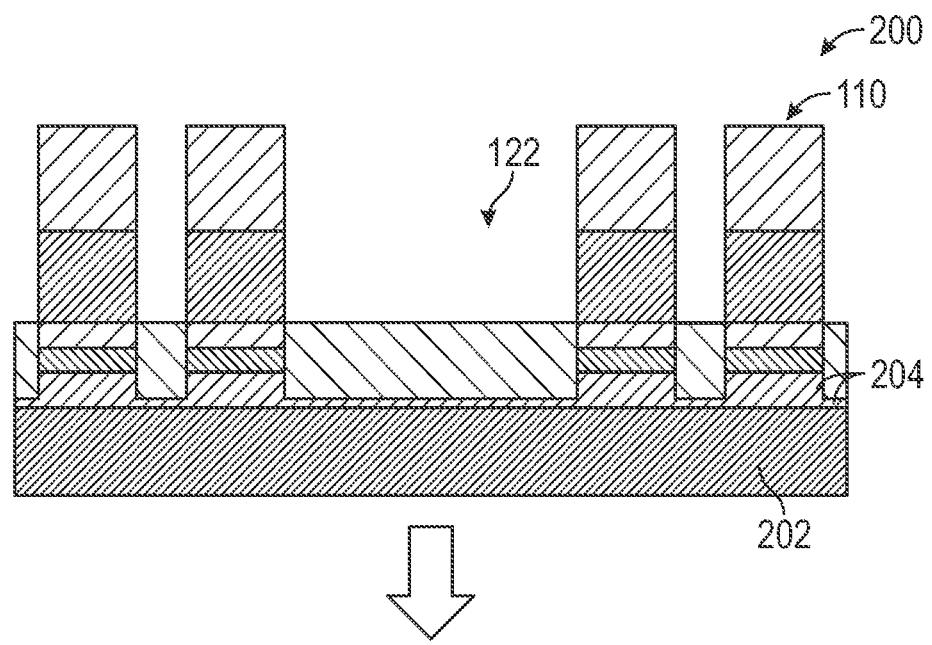
Figure 2H:
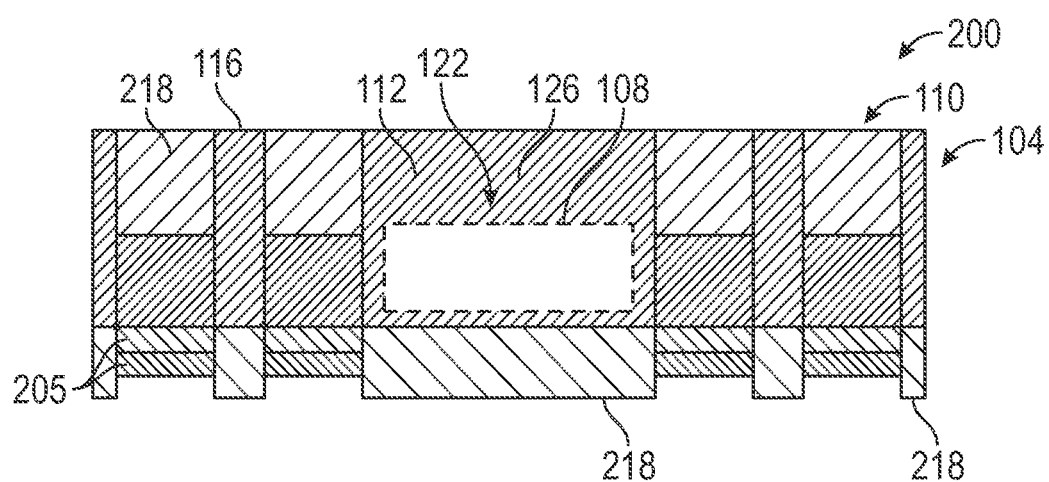

FIG. 1 schematically illustrates a cross-section side view of an example electronic system 100 that can comprise an integrated circuit (IC) package assembly 102, in accordance with some embodiments. In some embodiments, the electronic system 100 and IC package assembly 102 can include a first microelectronic device 104 and a second microelectronic device 106. The first microelectronic device 104 can include one or more electronic components 108, electrically conductive pillars 110 and a substrate 112.

The IC package assembly 102 is shown in a highly schematic manner and can include a wide variety of suitable configurations in various embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the first microelectronic device 104 and other components of the IC package assembly 102 are contemplated and can be used in other embodiments.

In some embodiments, the first microelectronic device 104 may represent a discrete product made from a semiconductor material using semiconductor fabrication techniques such as thin film deposition, lithography, etching, and the like used in connection with forming complementary devices such as metal-oxide-semiconductor (CMOS) devices. In some embodiments, the first microelectronic device 104 may be, include, or be a part of a processor, memory, SoC, or ASIC.

In some embodiments, the first microelectronic device 104 can be physically and electrically coupled with the second microelectronic device 106, as shown in FIG. 1 via one or more electrical connections 114 (e.g., one or more microballs, direct contact, bumps, or the like). Other suitable techniques to physically and/or electrically couple the first microelectronic device 104 with the second microelectronic device 106 can be used in other embodiments. The one or more package level electrical connections 114 can electrically and physically couple the electrically conductive pillars 110 with electrical contacts or other electrically conductive features (not shown) in the second microelectronic device 106 to provide a pathway for electrical signals to and from the first microelectronic device 104. The one or more electrical connections 114 can be disposed on a first major surface 116 of the first microelectronic device 104 at the electrically conductive pillars 110. The first major surface 116 can be opposed by a second major surface 118 of the first microelectronic device 104. According to some embodiments, one or more electrical connections (not shown) may also be disposed adjacent or at the second major surface 118 along a second end of the electrically conductive pillars 110 opposing the electrical connections 114.

The one or more electronic components 108 are schematically shown in FIG. 1. The one or more electronic components 108 (e.g., one or more dies, capacitors, inductors, or other types of electronic component(s)) can be electrically and/or physically coupled with the substrate 112 and can be embedded therein as shown in the embodiment of FIG. 1. The electrically conductive pillars 110 can extend from at or adjacent the first major surface 116 through apertures 120 in the substrate 112 in a z-direction as indicated by the Cartesian coordinate system of FIG. 1 toward the second major surface 118. The electrically conductive pillars 110 can have a major dimension in the z-direction. The z-direction can also be a build-up direction of the substrate 112 and the electrically conductive pillars 110 as will be discussed subsequently.

The one or more electronic components 108 can be disposed in a volume 122 within the substrate 112 defined between the electrically conductive pillars 110. In particular, the electrically conductive pillars 110 can be disposed laterally (measured in x-direction) and/or longitudinally (measured in y-direction) around the one or more electronic components 108). The volume 122 is only illustrated in two dimensions in FIG. 1. Some of the electrically conductive pillars 110 can electrically connect the one or more electronic components 108 to the second microelectronic device 106 or another electronic component (now shown).

The one or more electronic components 108 may be attached to and/or embedded in the substrate 112 in a wide variety of suitable known configurations not specifically illustrated. For example, the one or more electronic components 108 can comprise a die having active circuitry that is attached to a surface of the substrate 112 using die-level interconnect structures that are not specifically shown.

As is further discussed subsequently, the substrate 112 can generally include a first portion 124 and a second portion 126 with the one or more electronic components 108 in the exemplary embodiment embedded in the second portion 126. The first portion 124 and the second portion 126 can variously be comprised of a plurality of substrate layers of the same or different materials. Such plurality of substrate layers are not specifically shown in FIG. 1. Such plurality of substrate layers can be one or more semiconductor substrate layer(s), one or more electronic component layer(s), and/or one or more interconnect layer(s). The semiconductor substrate layer(s), and hence parts of the first and second portions 124, 126 can be substantially composed of a bulk semiconductor material such as, for example, silicon, in some embodiments. The one or more device layer(s) can represent a region such as the one or more electronic components 108 where active devices are formed on the semiconductor substrate. The one or more interconnect layers may include interconnect structures such as the electrically conductive pillars 110, which are configured to route electrical signals to or from the active devices in the one or more device layers. For example, the one or more interconnect layers may include trenches and/or vias to provide electrical routing and/or contacts.

In some embodiments, the electrically conductive pillars 110 can be die-level interconnect structures that are configured to route electrical signals between the first microelectronic component 104 and other electrical devices including the second microelectronic component 106. The electrical signals may include, for example, input/output (I/O) signals and/or power/ground signals that are used in connection with operation of the one or more electronic components 108. In some embodiments, the electrically conductive pillars 110 include substrate embedded and different material sandwiched solder elements formed according to techniques described herein.

In some embodiments, the substrate 112 can be an epoxy-based laminate substrate having a core and/or build-up layers such as, for example, an Ajinomoto Build-up Film (ABF) substrate having a dielectric film material that is an epoxy based resin with a balance material (e.g. epoxy or silica) ranging from about 20 wt % to about 95 wt % of the dielectric, about 90 wt % to about 95 wt % of dielectric layer 210, less than equal to, or greater than about 50 wt %, 55, 60, 65, 70, 75, 80, 85, 90, or 95 wt % of the dielectric. The substrate 112 can include other suitable types of substrates in other embodiments including, for example, substrates formed from glass, ceramic, or semiconductor materials. As described above, in some embodiments the substrate 112 can include conductive elements that are at least partially embedded within a dielectric material. This structure and details of the layers described above may not be shown specifically in FIG. 1, but could be part of the one or more electronic components 108, for example.

In the embodiment of FIG. 1, the electrically conductive pillars 110 comprise package-level features configured to route electrical signals between the first microelectronic device 104, the one or more electronic components 108, the second microelectronic device 106, and/or another microelectronic device (not shown) that can be disposed below the first microelectronic device 104. However, it should be noted that in some embodiments the electrically conductive pillars 110 can additionally or alternatively be used within a single microelectronic device such as the first microelectronic device 104 to route electrical signals between components of the one or more electronic components 108, for example.

In the embodiment of FIG. 1, the electrically conductive pillars 110 can comprise a plurality of portions including a first portion 130, a second portion 132, a third portion 134 and a fourth portion 136. As described below, these portions 130, 132, 134, 136 can be formed of different electrically conductive materials in some cases. As shown in FIG. 1, the electrically conductive pillars 110 can have a constant cross-sectional shape. However, the contemplated shape may be any suitable shape. Non-limiting examples of suitable constant cross-sectional shapes include a circle, an oval, a triangle, a square, a rectangle, a pentagon, a hexagon, a heptagon, and an octagon.

The first portion 130 can abut the electrical connections 114 and can be physically and electrically coupled thereto. The first portion 130 can be positioned in the second portion 126 of the substrate 112. The first portion 130 at a first end can extend to or adjacent the first major surface 116. The first portion 130 can extend in the z-direction to a second end that abuts the second portion 132 to be physically and electrically coupled thereto. According to the embodiment of FIG.

1, the first portion 130 can be formed of a first electrically conductive material 130A having a first stiffness. The first electrically conductive material 130A can be a suitable electrically conductive material, for example, nickel (Ni), palladium (Pd), gold (Au), silver (Ag), copper (Cu), and alloys thereof. According to the embodiment of FIG. 1, the first electrically conductive material 130A is Cu. The first electronically conductive material 130A can be comprised of one or more layers of material deposited as part of a build-up.

As described herein, the electrically conductive materials described herein can be a metal, a metal alloy, or a composite containing a metal. The metal may range from about 50 wt % to about 100 wt % of the conductive material, about 95 wt % to about 100 wt % of the conductive material, less than, equal to, or greater than about 50 wt %, 55, 60, 65, 70, 75, 80, 85, 90, 95, or 100 wt % of the conductive material.

The second portion 132 can abut the first portion 130 on a first end to be physically and electrically coupled thereto. The second portion 132 can be positioned in the first portion 124 or the second portion 126 of the substrate 112. The second portion 132 has a second end opposing the first end that is abutted by the third portion 134. According to the embodiment of FIG. 1, the second portion 132 comprises a solder element 138 that is formed of a second electrically conductive material 138A that differs from the first electrically conductive material 130A and/or the second electrically conductive material 138A has a second stiffness that is less than the first stiffness of the electrically conductive material 130A. The second electrically conductive material 138A can be comprised of one or more layers of solder deposited as part of a build-up.

According to the embodiment of FIG. 1, the second electrically conductive material 138A is a tin (Sn) alloy. For example, the second electrically conductive material 138A can be one of a Sn/Cu alloy, Sn/Ag alloy, Sn/Ag/Cu alloy or Sn/Sb alloy. The percentage content of Sn by wt % can be can be from about 100 to 70 or a desire amount within the ranges provided such that the second electrically conductive material 138A can be molten or otherwise compliant during typical reflow temperatures of between about 150° C. and 260° C. between the first microelectronic device 104 and the second microelectronic device 106. For example, at a reflow temperature of 260° C., the tin (Sn) content of the second electrically conductive material 138A when a Sn/Cu alloy is utilized can allow the solder element 138 to be molten during the reflow. As used herein the term "compliant" means little or no strain hardening occurs as the material is highly plastic in nature and potentially in a molten, softened or near molten state. That way, during temperature cure condition, the material can realign itself to the equilibrium configuration of the interface(s).

The third portion 134 of the electrically conductive pillars 110 can abut a second end of the second portion 132 to be physically and electrically coupled thereto. The third portion 134 can be positioned in the first portion 124 of the substrate 112. The third portion 134 can be formed of a third electrically conductive material 134A that differs from the second electrically conductive material 138A and can have a third stiffness that is greater than that of the second stiffness of the second electrically conductive material 138A. According to one embodiment, the third portion 134 can be formed of the third electrically conductive material 134A that is the same as the first electrically conductive material 130A having the same (or different) stiffness as the first stiffness of the first electrically conductive material 130A. Thus, in the embodiment of FIG. 1, the third electrically conductive material 134A can be Cu matching that of the Cu used for the first electrically conductive material 130A. However, in other embodiments, the third electrically conductive material 134A can differ from both the first electrically conductive material 130A and the second electrically conductive material 138A, and therefore, the third stiffness can differ from the first stiffness of the first electrically conductive material 130A and the second stiffness of the second electrically conductive material 138A. The third electronically conductive material 134A can be comprised of one or more layers of material deposited as part of a build-up.

In contrast, to the second electrically conductive material 138A, which can be molten or otherwise complaint during reflow when the first microelectronic device 104 is bonded to the second microelectronic device 106, in the embodiment of FIG. 1, the first electrically conductive material 130A and/or the third electrically conductive material 134A can be non-molten or not compliant (i.e. undergo strain hardening) in the manner of the second electrically conductive material 138A.

The fourth portion 136 of the electrically conductive pillars 110 can abut a second end of the third portion 134 to be physically and electrically coupled thereto. The fourth portion 136 can be positioned in the first portion 124 of the substrate 112. The fourth portion 136 can extend in the z-direction to a second end opposing the first end. The second end of the fourth portion 136 can be positioned at or recessed from the second major surface 118. The fourth portion 136 can be formed of another electrically conductive material or plurality of materials 136A that differs from the first electrically conductive material 130A, the second electrically conductive material 138A and/or the third electrically conductive material 134A. In some embodiments, the another electrically conductive material or plurality of materials 136A can have another stiffness that differs from that of the first stiffness and the second stiffness of the first electrically conductive material 130A and the second electrically conductive material 138A, respectively. According to the embodiment of FIG. 1, the another electrically conductive material or plurality of materials 136A can comprise layers of a Ni/Pd/Au.

As shown in the embodiment of FIG. 1, the first portion 130, the second portion 132 and the third portion 134 are stacked to extend in a z-axis direction of electrical connection between the first microelectronic device 104 and the second microelectronic device 106. The second portion 132 is disposed within the substrate 112 and is sandwiched between the first portion 130 and the third portion 134. Put another way, the first and third portions 130, 134 can be disposed to either end of the second portion 132, such that the second portion 132 can comprise an intermediate portion of the electrically conductive pillars 110. As discussed above, the second portion 132 can be formed of the second electrically conductive material 138A, which differs from the material(s) that forms the first portion 130 and the third portion 134. The second portion 132 can have different material related properties than those of the first portion 130 and the second portion 134. For example, the second portion 132 can have a relatively lower stiffness than the stiffness of the first portion 130 and the third portion 134. The second portion 132 can be relatively more compliant than the first portion 130 and the third portion 134. The second electrically conductive material 138A of the second portion 132 can also have a lower melting point than the electrically conductive material(s) of the first portion 130 and the third portion 134. The above described structure and material properties (e.g., sandwiching the second portion 132 between the first portion 130 and the third portion 134 within the substrate 112, and providing for a different material in the second portion 132 relative to the first portion 130 and the third portion 134) can provide for a more compliant pillar and package interconnection structure that can better absorb stress that develops due to CTE mismatch during reflow when the first microelectronic device is bonded to another electronic device. Thus, the presently described structure and material properties can reduce the likelihood of die cracking or other CTE related failure.

FIG. 2 shows an exemplary method 200 of build-up for the first microelectronic component 104 previously described in reference to FIG. 1. As with FIG. 1, in FIG. 2 the first microelectronic component 104 is shown in a highly schematic manner.

In step (a) of the method 200, the first portion 124 of the substrate 112 can be formed on a temporary carrier 202. The temporary carrier 202 and/or the first portion 124 can have one or more layers including one or more layers of an electrolytic electrically conductive material 204 such as a copper foil that can act as a seed layer(s) for various features of the first electronic device 104 such as at least one portion 205 of the electrically conductive pillars 110. Step (a) of the method 200 shows the fourth portion 136 and the third portion 134 can be the at least one portion 205, which can be formed as part of the forming of the first portion 124 of the substrate 112. However, the at least one portion 205 can be formed in a step (not shown) sequent to the forming of the first portion 124 (and/or the copper foil) in some embodiments.

In step (b), a photo-definable and reflow resistant material 206 can be placed over the first portion 124 of the substrate 112. The photo-definable and reflow resistant material 206 can be a high volume material such as a dry film photoresist, for example commercially available Taiyo material. The photo-definable and reflow resistant material 206 can be laminated to the first portion 124, patterned and opened to create apertures 208 as shown in step (b). In step (c), the solder element 138 can be placed in the plurality of aperture 208 in the photo-definable and reflow resistant material 206. The solder element 138, when so placed, abuts the at least one portion 205 (in particular, the third portion 134) of the plurality of electrically conductive pillars 110 and comprises an intermediate portion 210 (previously called the second portion 132 in reference to FIG. 1) of the plurality of electrically conductive pillars 110. According to the step (c), the solder element 138 can be placed by one of pasting and printing the solder element 138 through a stencil 212 or by dropping the solder element 138 in the form of a micro-ball through the stencil 212 into the apertures 208.

At step (d), the method 200 shows the solder element 138 can be reflowed to achieve a desired shape for the solder element 138 and create a desired physical and electrical connection between the solder element 138 and the at least one portion 205. The another photo-definable material 214 can be placed on the photo-definable and reflow resistant material 206 as shown in step (e). The another photo-definable material 214 can be a same or different material as the photo-definable and reflow resistant material 206, for example. However, the another photo-definable material 214 need not be reflow resistant according to some examples. The another photo-definable material 214 can be laminated to the photo-definable and reflow resistant material 206, patterned and opened to create apertures 216 as shown in step (e).

Step (f) of the method 200 shows plating another portion 218 (previously called the first portion 130 in reference to FIG. 1) of the plurality of electrically conductive pillars 110 on the intermediate portion 210 of the plurality of electrically conductive pillars 110 such that the intermediate portion 210 of the plurality of electrically conductive pillars 110 can be positioned between the at least one portion 205 of the plurality of electrically conductive pillars 110 and the another portion 218 of the plurality of electrically conductive pillars 110. Electroplated metal that forms part of the at least one portion 205 and the another portion 218 can be deposited from a bath that has a source for metal (see above discuss of suitable metal or alloy), which may include any suitable mixture of components dispersed or dissolved in water. For example, bath can include a copper salt. While not so limited, the copper salt may range from about 20 wt % to about 70 wt % of electrolytic bath, about 50 wt % to about 60 wt %, less than, equal to, or greater than about 20 wt %, 25, 30, 35, 40, 45, 50, 55, 60, 65, 70 wt % of electrolytic bath. Non-limiting examples of the copper salt include cupric sulfate, copper chloride, or a mixture thereof.

The electrolytic bath can include a rate controlling agent such as an accelerator or suppressor. The rate controlling agent may range from about 20 wt % to about 70 wt % of electrolytic composition, less than, equal to, or greater than about 20 wt %, 25, 30, 35, 40, 45, 50, 55, 60, 65, 70 wt % of electrolytic composition. The rate controlling agent may include one or more compounds that are capable of suppressing the deposition rate of the metal in certain portions of the substrate while increasing the deposition rate of the metal in other portions of the substrate. For instance, rate controlling agent can include polyethers such as polyethylene glycol (PEG), polypropylene glycol (PPG), nitrogen bearing heterocyclic or non-heterocyclic aromatic compounds, large molecular weight polyoxy-alkyl type compounds, and other high molecular weight polymers. Furthermore, rate controlling additives that may be used primarily to increase the copper deposition rate within high-aspect features include, but are not limited to, sulfur-based organic molecules such as bis (sodiumsulfopropyl) disulfide (SPS), other disulfides, and surfactants.

The electrolytic bath can further include a buffering agent. The buffering agent may range from about 5 wt % to about 50 wt % of electrolytic bath, about 10 wt % to about 20 wt %, less than, equal to, or greater than about 5 wt %, 10, 15, 20, 25, 30, 35, 40, 45, or 50 wt % of electrolytic bath. In embodiments of the invention, buffering agents that may be used include ethylene diamine tetraacetic acid (EDTA), hydroxyethylene diamine triacetic acid (HEDTA), Rochelle salt (also known as potassium sodium tartarate), an organic acid (e.g., citric acid, tartaric acid, etc.), ammonium citrate, lactate, triethanolamine (TEA), and ethylene diamine. Alternate buffering agents not mentioned here may be used as well.

Bath stabilizing agent(s) such as one or more compounds that are capable of stabilizing the bath against the formation of undesired cuprous oxide particles for electrolytic plating processes having relatively long nucleation times are also contemplated. The long nucleation times can help to completely fill features with high aspect ratios. In some implementations, the bath stabilizing agent may further function as a leveling agent to produce mirror-like plated surfaces. In some examples, bath stabilizing agents that may be used include, but are not limited to, thiourea, dypiridil, mercaptobenzothiazole (MBT), benzotriazole, Janus Green B (JGB), cyanide, vanadium pentoxide ($V_2O_5$), as well as certain high molecular weight polymers.

The method 200 in step (g) shows the another photo-definable material 214 and the photo-definable and reflow resistant material 206 removed such as by stripping with an etching process. This can create the recess in the volume 122 defined between the plurality of electrically conductive pillars 110. In step (h) the one or more electronic components 108 and the second portion 126 of the substrate 112 can be placed such as by build-up within the volume 122 and in other portions of the first microelectronics component 104 (e.g., between the plurality of electrically conductive pillars 110). As shown in step (g), the temporary carrier 202 (FIG. 2(*f*)) and the one or more layers of an electrically conductive material 204 (FIG. 2(*f*)) can be removed such as by etching or the like. This removal can recess the at least one portion 205 of the electrically conductive pillars 110 from the second major surface 118 such that electrical interconnections such as microballs, bumps or the like can be added if desired. The second portion 126 and the another portion 218 of the plurality of electrically conductive pillars 110 can be planarized to form the second major surface 116. In some embodiments, the another portion 218 and the second portion 126 can be configured to recess the another portion 218 of the plurality of electrically conductive pillars 110 from the first major surface 116 if desired. The another portion 218 and/or the at least one portion 205 can be optionally be roughed or can have an adhesion promoter that is applied thereto. Removal of the various components/features discussed in reference to the methods of FIGS. 2 and 3 can be accomplished by etching (physical or chemical), grinding, or Chemical Mechanical Polish (CMP), for example. Etching is provided in reference to certain steps as an exemplary process only.

Figure 3:
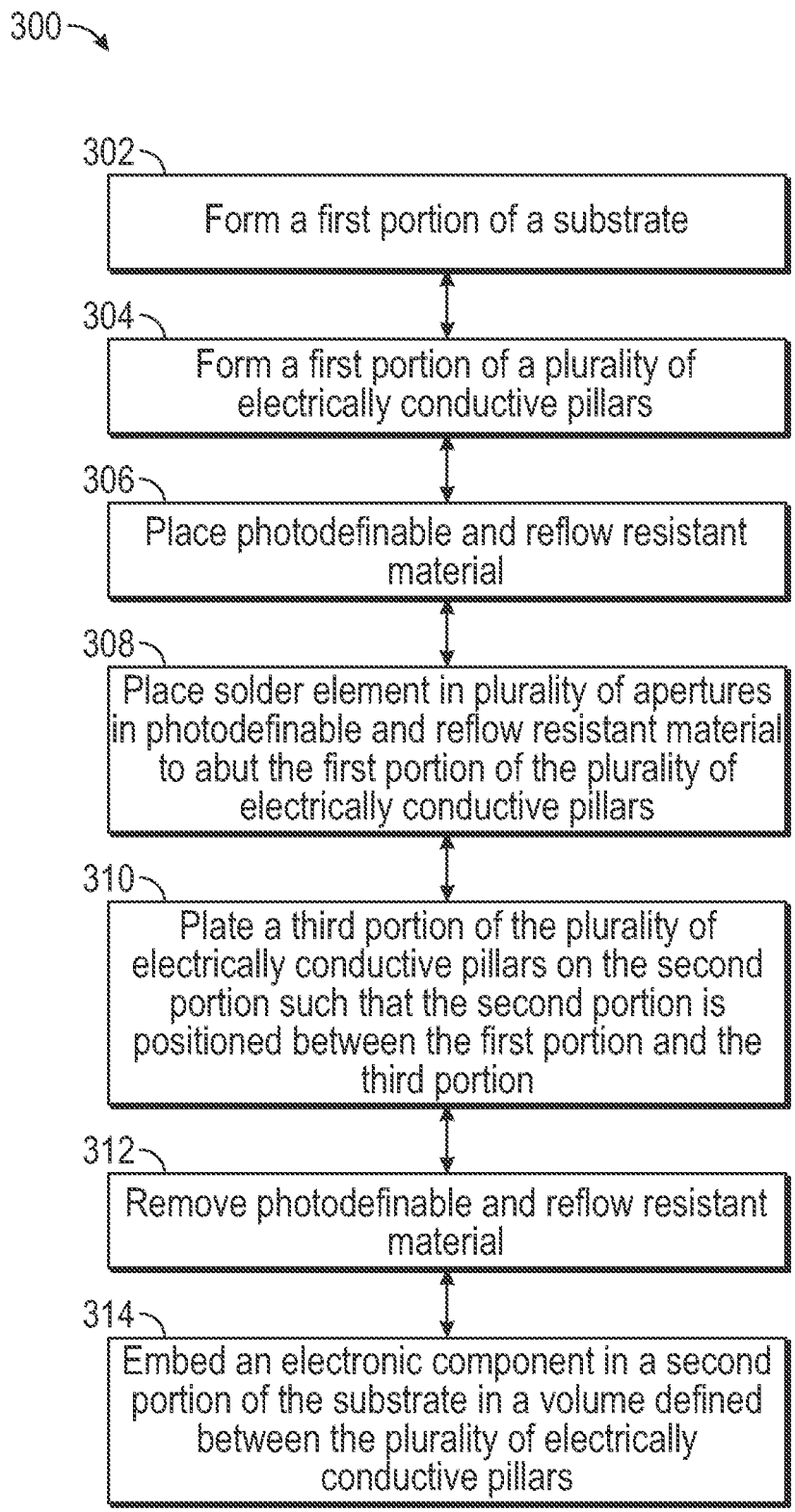
FIG. 3 is a schematic diagram illustrating the method of making the microelectronic device of FIG. 1, in accordance with various embodiments.

FIG. 3 shows an exemplary method 300 in the form of a flow diagram. According to the method 300, at step 302 the method 300 can form a first portion of a substrate. At step 304, the forming at least one portion of a plurality of electrically conductive pillars that is positioned in the first portion of the substrate. Such process can be by electroplating, for example. A photo-definable and reflow resistant material can be placed over the first portion of the substrate in step 306. In step 308, a solder element can be placed in a plurality of apertures in the photo-definable and reflow resistant material. The solder element can abut the at least one portion of the plurality of electrically conductive pillars and can comprise an intermediate portion of the plurality of electrically conductive pillars as another portion of the plurality of electrically conductive pillars can be placed 310 on the intermediate portion of the plurality of electrically conductive pillars such that the intermediate portion of the plurality of electrically conductive pillars is positioned between the at least one portion of the plurality of electrically conductive pillars and the another portion of the plurality of electrically conductive pillars. The intermediate portion of the plurality of electrically conductive pillars can be positioned within the substrate.

At step 312, the photo-definable and reflow resistant material can be removed. An electronic component can be embedded in a second portion of the substrate in a volume defined between the plurality of electrically conductive pillars at 314. According to further examples, the method 300 can include reflowing the solder element sequent to plating the third portion of the plurality of electrically conductive pillars. As previously discussed, the solder element can be formed of a second electrically conductive material that differs from a first electrically conductive material of the at least one portion and the another portion and has a second stiffness less than a first stiffness of the electrically conductive material of the at least one portion and the another portion. For example, the second electrically conductive material can comprise a tin (Sn) alloy, and the first electrically conductive material can comprise one of nickel (Ni), palladium (Pd), gold (Au), silver (Ag), copper (Cu), and alloys thereof.

The method 300 can also include reflowing so as to bond the microelectronic device to a second microelectronic device. During reflowing the second electrically conductive material can be at least one of molten and compliant and the first electrically conductive material can be non-molten. For step 308 of the method 300, placing the solder element can include one of pasting and printing the solder element through a stencil or dropping the solder element in the form of a micro-ball through the stencil.

Figure 4:
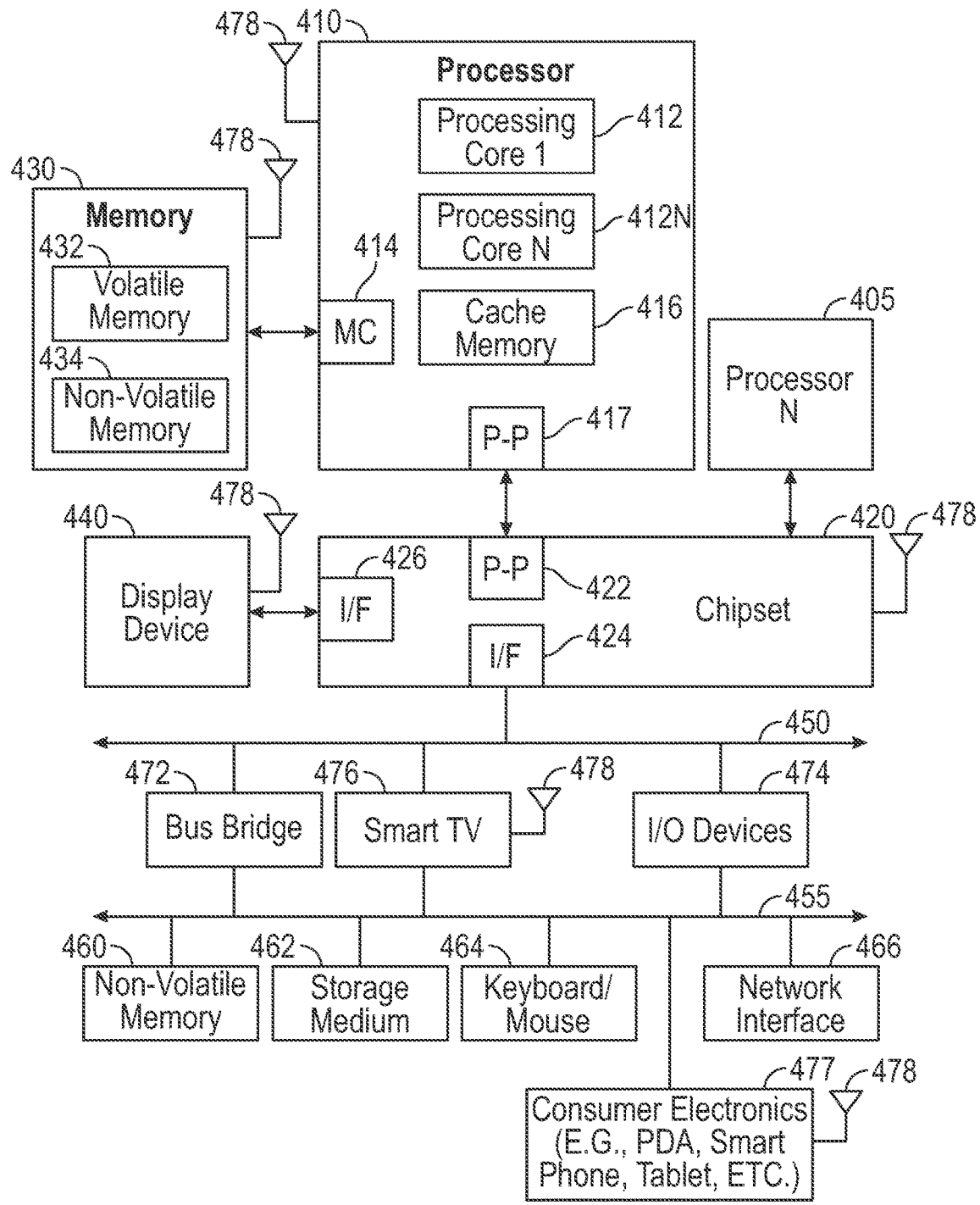
FIG. 4 is block diagram of an electronic system, in accordance with various embodiments.

FIG. 4 illustrates a system level diagram, according to an embodiment of the invention. For instance, FIG. 4 depicts an example of an electronic device (e.g., system) including the first microelectronic device 104 and/or the IC package assembly 102; FIG. 4 is included to show an example of a higher level device application for the present inventive subject matter. In an embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In an embodiment, processor 410 has one or more processing cores 412 and 412N, where 412N represents the Nth processor core inside processor 410 where N is a positive integer. In an embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions, and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In an embodiment, the wireless antenna 478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In an embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Chipset 420 may also be coupled to a wireless antenna 478 to communicate with any device configured to transmit and/or receive wireless signals.

Chipset 420 connects to display device 440 via interface 426. Display device 440 may be, for example, a liquid crystal display (LCD), a plasma display, cathode ray tube (CRT) display, or any other form of visual display device. In some embodiments of the invention, processor 410 and chipset 420 are merged into a single SOC. In addition, chipset 420 connects to one or more buses 450 and 455 that interconnect various elements 474, 460, 462, 464, and 466. Buses 450 and 455 may be interconnected together via a bus bridge 472. In an embodiment, chipset 420 couples with a non-volatile memory 460, a mass storage device(s) 462, a keyboard/mouse 464, and a network interface 466 via interface 424 and/or 426, smart TV 476, consumer electronic 477, etc.

In an embodiment, mass storage device 462 includes, but is not limited to, a solid state drive, a hard disk drive, a universal serial bus flash memory drive, or any other form of computer data storage medium. In an embodiment, network interface 466 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of cache memory 416) may be incorporated into processing core 412.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the disclosure, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Additional Embodiments

The following exemplary embodiments are provided, the numbering of which is not to be construed as designating levels of importance:

Example 1 is an electrically conductive pillar for a microelectronic device having a substrate, the electrically conductive pillar can comprise: a first portion formed of a first electrically conductive material having a first stiffness; a second portion abutting the first portion on a first end, wherein the second portion comprises a solder element formed of a second electrically conductive material that differs from the first electrically conductive material and has a second stiffness less than the first stiffness of the electrically conductive material, wherein the solder element is embedded within the substrate of the microelectronic device; and a third portion abutting the second portion on a second end of the second portion, the second end opposing the first end, wherein the third portion is formed of one of the first electrically conductive material having the first stiffness or a third electrically conductive material having a third stiffness greater than the second stiffness of the second electrically conductive material.

In Example 2, the electrically conductive pillar of Example 1, wherein the second electrically conductive material can comprise a tin (Sn) alloy.

In Example 3, the electrically conductive pillar of any one or any combination of Examples 1-2, wherein the first electrically conductive material can comprise one of nickel (Ni), palladium (Pd), gold (Au), silver (Ag), copper (Cu), and alloys thereof.

In Example 4, the electrically conductive pillar of any one or any combination of Examples 1-3, wherein the second electrically conductive material can have a melting temperature that is lower than the first electrically conductive material and the third electrically conductive material.

In Example 5, the electrically conductive pillar of any one or any combination of Examples 1-4, can further comprise a fourth portion abutting the third portion on an opposing end of the third portion from the second portion, wherein the fourth portion is formed of another electrically conductive material that differs from the first electrically conductive material and the second electrically conductive material, and wherein the another electrically conductive material has another stiffness that differs from that of the first stiffness and the second stiffness.

In Example 6, the electrically conductive pillar of Example 5, wherein another third electrically conductive material can comprise layers of a Ni/Pd/Au.

In Example 7, a microelectronic device can comprise: a substrate having a dielectric material; a plurality of electrically conductive pillars extending through the substrate, each of the plurality of electrically conductive pillars comprising: a first portion formed of a first electrically conductive material having a first stiffness, a second portion abutting the first portion on a first end, wherein the second portion comprises a solder element formed of a second electrically conductive material that differs from the first electrically conductive material and has a second stiffness less than the first stiffness of the electrically conductive material, and a third portion abutting the second portion on a second end of the second portion, the second end opposing the first end, wherein the third portion is formed of the first electrically conductive material having the first stiffness or a third electrically conductive material having a third stiffness greater than the second stiffness of the second electrically conductive material, and an electronic component embedded in the substrate in a volume defined between the plurality of electrically conductive pillars.

In Example 8, the microelectronic device of Example 7, wherein the first portion, second portion and third portion can be stacked to extend in a direction of electrical connection between the microelectronic device and a second microelectronic device, and wherein one or more of the plurality of electrically conductive pillars electrically connect the electronic component to the second microelectronic device.

In Example 9, the microelectronic device of any one or any combination of Examples 7-8, wherein the second electrically conductive material can comprise a tin (Sn) alloy, and wherein the first electrically conductive material comprises one of nickel (Ni), palladium (Pd), gold (Au), silver (Ag), copper (Cu), and alloys thereof.

In Example 10, the microelectronic device of any one or any combination of Examples 7-9, wherein the electronic component can comprise one of a die, a capacitor or an inductor.

In Example 11, the microelectronic device of any one or any combination of Examples 7-10, wherein the second electrically conductive material can have a melting temperature that is lower than the first electrically conductive material and the third electrically conductive material.

In Example 12, the microelectronic device of any one or any combination of Examples 7-11, wherein each of the plurality of electrically conductive pillars can have a fourth portion abutting the third portion on an opposing end of the third portion from the second portion, wherein the fourth portion is formed of an another electrically conductive material having another stiffness, and wherein the third electrically conductive material and the another stiffness differs from that of the second electrically conductive material and second stiffness, respectively.

In Example 13, an electronic system that can comprise: a microelectronic device that can comprise: a plurality of electrically conductive pillars extending through the substrate, each of the plurality of electrically conductive pillars can comprise: two portions each formed of electrically conductive material, and an intermediate portion positioned between the two portions, wherein the intermediate portion comprises a solder element formed of a second electrically conductive material that differs from the electrically conductive material and has a second stiffness less than a stiffness of the electrically conductive material, an electronic component embedded in the substrate in a volume defined between the plurality of electrically conductive pillars; and at least a second microelectronic device operably coupled to the microelectronic device.

In Example 14, the electronic system of Example 13, wherein the second electrically conductive material can have a melting temperature that is lower than the electrically conductive material.

In Example 15, the electronic system of any one or any combination of Examples 13-14, wherein the two portions and intermediate portion can be stacked to extend in a direction of electrical connection between the microelectronic device and the second microelectronic device, and wherein one or more of the plurality of electrically conductive pillars electrically connect the electronic component to the second microelectronic device.

In Example 16, a method of forming a microelectronic device can comprise: forming a first portion of substrate; forming at least one portion of a plurality of electrically conductive pillars that is positioned in the first portion of the substrate; placing a photodefinable and reflow resistant material over the first portion of the substrate; placing a solder element in a plurality of apertures in the photodefinable and reflow resistant material, the solder element abutting the at least one portion of the plurality of electrically conductive pillars and comprising an intermediate portion of the plurality of electrically conductive pillars; plating another portion of the plurality of electrically conductive pillars on the intermediate portion of the plurality of electrically conductive pillars such that the intermediate portion of the plurality of electrically conductive pillars is positioned between the at least one portion of the plurality of electrically conductive pillars and the another portion of the plurality of electrically conductive pillars; removing the photodefinable and reflow resistant material; and embedding an electronic component in a second portion of the substrate in a volume defined between the plurality of electrically conductive pillars, and wherein the intermediate portion of the plurality of electrically conductive pillars is positioned within the substrate.

In Example 17, the method of Example 16, can further comprise reflowing the solder element sequent to plating the third portion of the plurality of electrically conductive pillars.

In Example 18, the method of any one or any combination of Examples 16-17, wherein the solder element can be formed of a second electrically conductive material that differs from a first electrically conductive material of the at least one portion and the another portion and has a second stiffness less than a first stiffness of the electrically conductive material of the at least one portion and the another portion.

In Example 19, the method of Example 18, wherein the second electrically conductive material can comprise a tin (Sn) alloy, and wherein the first electrically conductive material comprises one of nickel (Ni), palladium (Pd), gold (Au), silver (Ag), copper (Cu), and alloys thereof.

In Example 20, the method of Example 19, can further comprise reflowing so as to bond the microelectronic device to a second microelectronic device, wherein during reflowing the second electrically conductive material is at least one of molten and compliant and the first electrically conductive material is non-molten.

In Example 21, the method of any one or any combination of Examples 16-20, wherein placing the solder element can include one of pasting and printing the solder element through a stencil or dropping the solder element in the form of a micro-ball through the stencil.

The invention claimed is:

1. An electrically conductive pillar for a microelectronic device having a substrate, the electrically conductive pillar comprising:
a first portion formed of a first electrically conductive material having a first stiffness;
a second portion abutting the first portion on a first end, wherein the second portion comprises a solder element formed of a second electrically conductive material that differs from the first electrically conductive material and has a second stiffness less than the first stiffness of the electrically conductive material, wherein the solder element is embedded within the substrate of the microelectronic device; and
a third portion abutting the second portion on a second end of the second portion, the second end opposing the first end, wherein the third portion is formed of one of the first electrically conductive material having the first stiffness or a third electrically conductive material having a third stiffness greater than the second stiffness of the second electrically conductive material.

2. The electrically conductive pillar of claim 1, wherein the second electrically conductive material comprises a tin (Sn) alloy.

3. The electrically conductive pillar of claim 1, wherein the first electrically conductive material comprises one of nickel (Ni), palladium (Pd), gold (Au), silver (Ag), copper (Cu), and alloys thereof.

4. The electrically conductive pillar of claim 1, wherein the second electrically conductive material has a melting temperature that is lower than the first electrically conductive material and the third electrically conductive material.

5. The electrically conductive pillar of claim 1, further comprising a fourth portion abutting the third portion on an opposing end of the third portion from the second portion, wherein the fourth portion is formed of another electrically conductive material that differs from the first electrically conductive material and the second electrically conductive material, and wherein the another electrically conductive material has another stiffness that differs from that of the first stiffness and the second stiffness.

6. The electrically conductive pillar of claim 5, wherein another third electrically conductive material comprises layers of a Ni/Pd/Au.

7. A microelectronic device comprising:
a substrate having a dielectric material;
a plurality of electrically conductive pillars extending through the substrate, each of the plurality of electrically conductive pillars comprising:
a first portion formed of a first electrically conductive material having a first stiffness,
a second portion abutting the first portion on a first end, wherein the second portion comprises a solder element formed of a second electrically conductive material that differs from the first electrically conductive material and has a second stiffness less than the first stiffness of the electrically conductive material, and
a third portion abutting the second portion on a second end of the second portion, the second end opposing the first end, wherein the third portion is formed of one of the first electrically conductive material having the first stiffness or a third electrically conductive material having a third stiffness greater than the second stiffness of the second electrically conductive material, and
an electronic component embedded in the substrate in a volume defined between the plurality of electrically conductive pillars.

8. The microelectronic device of claim 7, wherein the first portion, second portion and third portion are stacked to extend in a direction of electrical connection between the microelectronic device and a second microelectronic device, and wherein one or more of the plurality of electrically conductive pillars electrically connect the electronic component to the second microelectronic device.

9. The microelectronic device of claim 7, wherein the second electrically conductive material comprises a tin (Sn) alloy, and wherein the first electrically conductive material comprises one of nickel (Ni), palladium (Pd), gold (Au), silver (Ag), copper (Cu), and alloys thereof.

10. The microelectronic device of claim 7, wherein the electronic component comprises one of a die, a capacitor or an inductor.

11. The microelectronic device of claim 7, wherein the second electrically conductive material has a melting temperature that is lower than the first electrically conductive material and the third electrically conductive material.

12. The microelectronic device of claim 7, wherein each of the plurality of electrically conductive pillars has a fourth portion abutting the third portion on an opposing end of the third portion from the second portion, wherein the fourth portion is formed of an another electrically conductive material having another stiffness, and wherein the third electrically conductive material and the another stiffness differs from that of the second electrically conductive material and second stiffness, respectively.

13. An electronic system, comprising:
a microelectronic device comprising:
a plurality of electrically conductive pillars extending through the substrate, each of the plurality of electrically conductive pillars comprising:
two portions each formed of electrically conductive material, and an intermediate portion positioned between the two portions, wherein the intermediate portion comprises a solder element formed of a second electrically conductive material that differs from the electrically conductive material and has a second stiffness less than a stiffness of the electrically conductive material, and an electronic component embedded in the substrate in a volume defined between the plurality of electrically conductive pillars; and at least a second microelectronic device operably coupled to the microelectronic device.

14. The electronic system of claim 13, wherein the second electrically conductive material has a melting temperature that is lower than the electrically conductive material.

15. The electronic system of claim 13, wherein the two portions and intermediate portion are stacked to extend in a direction of electrical connection between the microelectronic device and the second microelectronic device, and wherein one or more of the plurality of electrically conductive pillars electrically connect the electronic component to the second microelectronic device.

16. A method of forming a microelectronic device comprising:

forming a first portion of substrate;

forming at least one portion of a plurality of electrically conductive pillars that is positioned in the first portion of the substrate;

placing a photodefinable and reflow resistant material over the first portion of the substrate;

placing a solder element in a plurality of apertures in the photodefinable and reflow resistant material, the solder element abutting the at least one portion of the plurality of electrically conductive pillars and comprising an intermediate portion of the plurality of electrically conductive pillars;

plating another portion of the plurality of electrically conductive pillars on the intermediate portion of the plurality of electrically conductive pillars such that the intermediate portion of the plurality of electrically conductive pillars is positioned between the at least one portion of the plurality of electrically conductive pillars and the another portion of the plurality of electrically conductive pillars;

removing the photodefinable and reflow resistant material; and embedding an electronic component in a second portion of the substrate in a volume defined between the plurality of electrically conductive pillars, and wherein the intermediate portion of the plurality of electrically conductive pillars is positioned within the substrate.

17. The method of claim 16, further comprising reflowing the solder element sequent to plating the third portion of the plurality of electrically conductive pillars.

18. The method of claim 16, wherein the solder element is formed of a second electrically conductive material that differs from a first electrically conductive material of the at least one portion and the another portion and has a second stiffness less than a first stiffness of the electrically conductive material of the at least one portion and the another portion.

19. The method of claim 18, wherein the second electrically conductive material comprises a tin (Sn) alloy, and wherein the first electrically conductive material comprises one of nickel (Ni), palladium (Pd), gold (Au), silver (Ag), copper (Cu), and alloys thereof.

20. The method of claim 18, further comprising reflowing so as to bond the microelectronic device to a second microelectronic device, wherein during reflowing the second electrically conductive material is at least one of molten and compliant and the first electrically conductive material is non-molten.

21. The method of claim 16, wherein placing the solder element includes one of pasting and printing the solder element through a stencil or dropping the solder element in the form of a micro-ball through the stencil.

* * * * *